United States Patent
Day et al.

(10) Patent No.: US 6,392,887 B1
(45) Date of Patent: May 21, 2002

(54) PLGA-BGA SOCKET USING ELASTOMER CONNECTORS

(75) Inventors: Jeffrey W. Day, Portland; Steven L. Pollock, Hillsboro, both of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/461,680

(22) Filed: Dec. 14, 1999

(51) Int. Cl.[7] ................................................. H05K 7/20
(52) U.S. Cl. ........................ 361/704; 361/702; 361/703; 361/707; 361/717; 361/718; 361/719; 174/16.3; 257/727; 257/706; 257/718; 165/80.2; 165/80.3
(58) Field of Search .................................. 361/688, 702, 361/703, 704, 707, 708, 709, 712, 713, 717–720, 760, 761, 767, 768; 257/706, 707, 718, 719, 727; 165/80.3, 185; 439/66, 67, 71, 73

(56) References Cited

U.S. PATENT DOCUMENTS

| | | | | |
|---|---|---|---|---|
| 4,664,309 A | * | 5/1987 | Allen et al. | 228/180.2 |
| 5,135,402 A | | 8/1992 | Sweeney | |
| 5,210,939 A | | 5/1993 | Mallik et al. | |
| 5,321,583 A | | 6/1994 | McMahon | |
| 5,362,656 A | | 11/1994 | McMahon | |
| 5,420,461 A | | 5/1995 | Mallik et al. | |
| 5,506,756 A | | 4/1996 | Haley | |
| 5,594,624 A | * | 1/1997 | Clemens et al. | 361/704 |
| 5,702,256 A | | 12/1997 | Severn | |
| 5,751,556 A | | 5/1998 | Butler et al. | |
| 5,772,451 A | * | 6/1998 | Dozier, II et al. | 439/70 |
| 5,791,914 A | * | 8/1998 | Loranger et al. | 439/71 |
| 5,810,607 A | * | 9/1998 | Shih et al. | 439/66 |
| 5,811,883 A | | 9/1998 | Ichikawa et al. | |
| 5,812,379 A | | 9/1998 | Barrow | |
| 5,815,372 A | | 9/1998 | Gallas | |
| 5,829,988 A | * | 11/1998 | McMillan et al. | 439/70 |
| 5,833,471 A | * | 11/1998 | Selna | 439/73 |
| 5,834,335 A | * | 11/1998 | Buschbom | 438/107 |
| 5,880,528 A | | 3/1999 | Seshan et al. | |
| 5,883,783 A | | 3/1999 | Turturro | |
| 5,889,652 A | | 3/1999 | Turturro | |
| 5,894,410 A | | 4/1999 | Barrow | |
| 5,905,638 A | * | 5/1999 | MacDonald, Jr. et al. | 361/769 |
| 5,917,702 A | | 6/1999 | Barrow | |
| 5,947,751 A | * | 9/1999 | Massingill | 439/70 |
| 5,973,924 A | | 10/1999 | Gillespie, Jr. | |
| 5,991,161 A | | 11/1999 | Samaras et al. | |
| 6,011,696 A | | 1/2000 | Mahajan et al. | |
| 6,046,597 A | * | 4/2000 | Barabi | 324/755 |
| 6,062,873 A | * | 5/2000 | Kato | 439/71 |
| 6,078,500 A | * | 6/2000 | Beaman et al. | 361/704 |

* cited by examiner

Primary Examiner—Gerald Tolin
Assistant Examiner—Boris L. Chervinsky
(74) Attorney, Agent, or Firm—Blakely, Sokoloff, Taylor & Zafman LLP

(57) ABSTRACT

An electronic assembly that may include an elastomeric connector. The elastomeric connector may couple the solder ball of a BGA integrated circuit package to a substrate. The elastomeric connector provides an interconnect that may compensate for variations in the solder balls and a lack of flatness in the package and/or substrate.

23 Claims, 1 Drawing Sheet

PLGA-BGA SOCKET USING ELASTOMER CONNECTORS

BACKGROUND OF THE INVENTION

1. Field of the Invention

The present invention relates to an electronic assembly that contains an elastomeric connector. The elastomeric connector couples a ball grid array integrated circuit package to a substrate such as the motherboard of a computer.

2. Background Information

Integrated circuits are typically assembled into packages that are mounted to a printed circuit board. There are various types of integrated circuit packages including ball grid array (BGA) packages. BGA packages contain an integrated circuit that is mounted to a substrate. The package also contains a plurality of solder balls that are attached to a bottom surface of the substrate. The BGA substrate typically contains routing traces and vias that connect the solder balls to the integrated circuit. The solder balls can be re-flowed to mount the BGA package to another substrate such as the motherboard of a computer.

Because of manufacturing tolerances one or more of the solder balls may be smaller than the other balls. When re-flowed the smaller solder balls may not form a sufficient electrical connection between the BGA package and the motherboard. The insufficient connection may create an open circuit in the assembly. Additionally, the re-flow process and/or assembly process of the BGA package may create a warpage in the package. The warpage will create a lack of flatness that may result in electrical opens in the final assembly. It would be desirable to provide a BGA electronic package assembly that would reduce the probability of electrical opens in the assembly.

The re-flow process typically requires special solder re-flow equipment. This equipment is expensive to purchase and maintain. Additionally, the re-flow process can degrade both the motherboard and the BGA package. It would be desirable to provide an assembly process for a BGA package that does not require a re-flow of the solder balls.

SUMMARY OF THE INVENTION

One embodiment of the present invention is an electronic assembly that may include an elastomeric connector. The elastomeric connector may couple a solder ball of an integrated circuit package to a substrate

DETAILED DESCRIPTION

Figure 1:
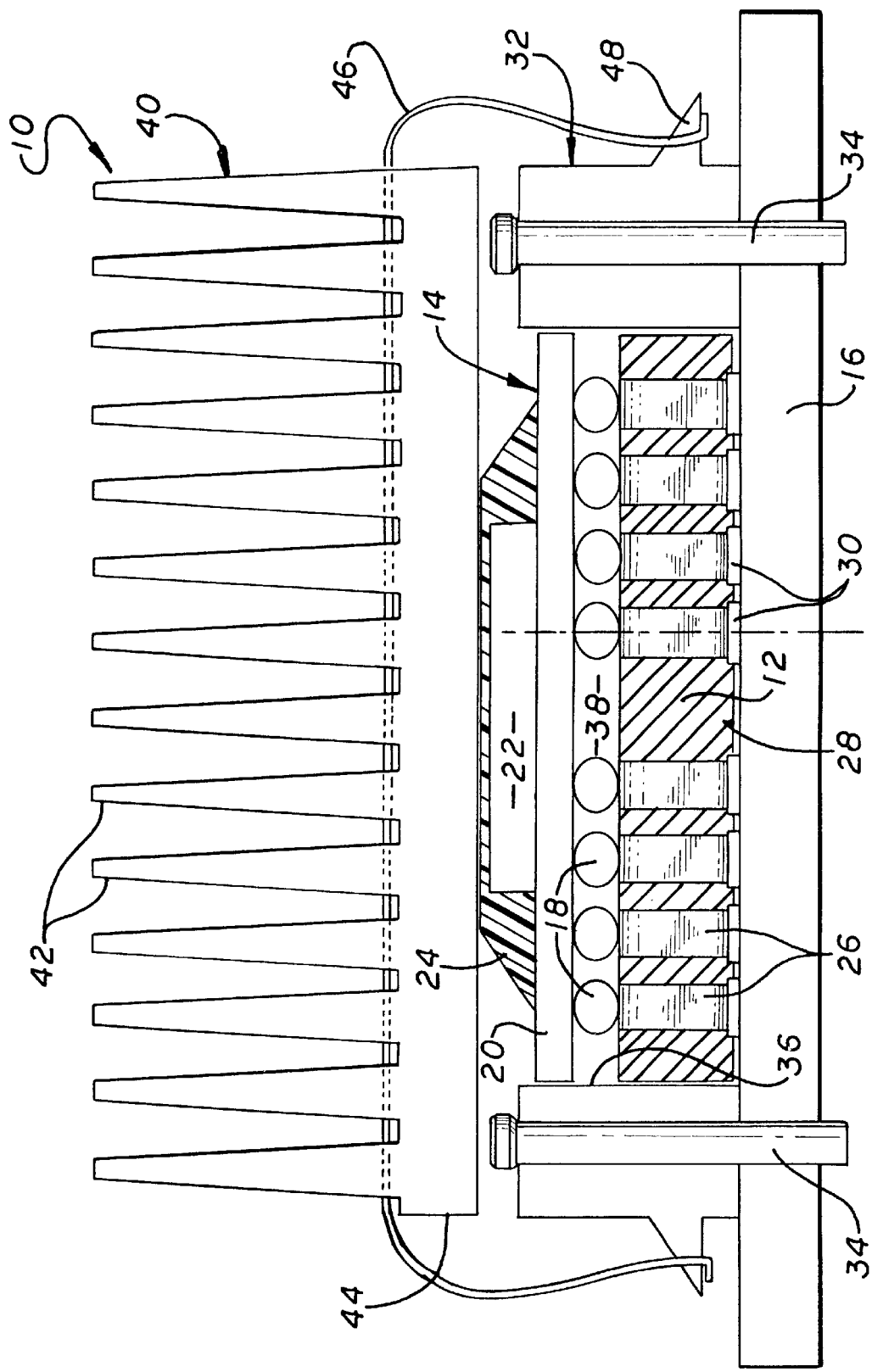
FIG. 1 is a side sectional view of an embodiment of an electronic assembly of the present invention.

Referring to the drawings more particularly by reference numbers, FIG. 1 shows an embodiment of an electronic assembly 10 of the present invention. The assembly 10 may include an elastomeric connector 12 that couples an integrated circuit package 14 to a substrate 16. The substrate 16 may be a motherboard of a computer. The integrated circuit package 14 may be a ball grid array (BGA) package that contains a plurality of solder balls 18 mounted to a package substrate 20. The package 14 may also contain an integrated circuit 22 that is mounted to the package substrate 20. The package substrate 20 may contain routing traces, vias etc. (not shown) that electrically connect the integrated circuit 22 to the solder balls 18. The integrated circuit 22 may be enclosed by an encapsulant 24. By way of example, the integrated circuit 22 may be a microprocessor.

The elastomeric connector 12 may contain a plurality of conductive portions 26 that are surrounded by a dielectric elastomeric material 28. Each conductive portion 26 is aligned with a solder ball 18 and a corresponding conductive surface pad 30 of the substrate 16. By way of example, the elastomeric connector 12 may contain a plurality of metallic leaves that are embedded into a silicone rubber pad. The leaves may be constructed from a gold or copper material. The conductive portions 26 provide an electrical connection between the solder balls 18 and the conductive surface pads 30.

The assembly 10 may include a housing 32 that captures and aligns the elastomeric connector 12 with the substrate 16. The housing 32 may be mounted to the substrate 16 by a plurality of mounting pins 34. The mounting pins 34 align the housing 32 with the surface pads 30. The housing 32 has inner walls 36 that define an opening 38. The integrated circuit package 14 and the elastomeric connector 12 are located within the inner opening 38.

The dimensions of the inner opening 38, package substrate 20 and the elastomeric connector 12 may be such that the inner walls 36 align the conductive portions 26 with both the solder balls 18 and the surface pads 30. The housing 30 may be constructed from a relatively inexpensive molded plastic material.

The assembly 10 may include a heat sink 40 that is coupled to the integrated circuit package 12. The heat sink 40 may include a plurality of fins 42 that extend from a pedestal 44. The pedestal 44 is coupled to the integrated circuit package 14. Heat generated by the integrated circuit 22 may flow through the heat sink 40 and into the ambient. The heat sink 40 improves the thermal efficiency of the assembly 10 as is well known in the art.

The heat sink 40 may be attached to the housing 32 by a spring clip 46. The spring clip 46 may be attached to corresponding tabs 48 of the housing 32. The spring 46 may be a steel wire that is flexible enough to wrap around the heat sink 40 but have a high enough yield point to exert a spring force onto the sink 40 and the package 14. The heat sink 40 may be attached to the housing 32 so that the spring clip 46 applies a downward force onto the elastomeric connector 12.

The downward force may push the connector 12 into a deflected state. The connector 12 may be deflected an amount which insures electrical contact between all of the solder balls 18 and corresponding surface pads 30 of the substrate 16. By way of example, the elastomeric connector 12 may be deflected an amount that exceeds the maximum cumulative z-axis tolerances of the substrate 16, connector 12, solder balls 18 and package 14. The elastomeric characteristic of the connector 12 can therefore compensate for variations in the flatness of the package 14 and/or substrate 16. Additionally, the elastomeric connector 12 can compensate for variations in the volume of each solder ball 18.

The assembly 10 can be assembled by initially mounting the housing 32 to the substrate 16. The elastomeric connector 12 and integrated circuit package 14 can then be placed within the inner opening 38 of the housing 32. The heat sink 40 can be attached to the housing 32 with the spring clip 46. Attachment of the heat sink 40 may push the package 14 and elastomeric connector 12 into the substrate 16 to insure an electrical connection between all of the solder balls 18 and corresponding surface pads 30. The process does not require a re-flow of the solder balls 18. Eliminating the re-flow process may decrease the cost and complexity of assembling the assembly 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:
   an integrated circuit package having a plurality of solder balls;
   a substrate having a plurality of surface pads;
   a pair of housing units mounted on said substrate, each of said housing units having an outwardly protruded tab;
   an elastomeric connector containing a plurality of conductive portions electrically coupling said solder balls to respective surface pads of said substrate and interposed in between said pair of housing units;
   a heat sink including a pedestal and a fin, said heat sink used to sandwich said integrated circuit package and said substrate; and,
   a spring clip having first and second ends, said spring clip to wrap around said heat sink so that said spring clip by way of said integrated circuit package applies a downward pressure onto said elastomeric connector while said first and second ends of said spring clip are firmly attached to respective tabs of said pair of housing units so that said spring clip by way of said substrate applies an upward pressure onto said elastomeric connector, thereby compressing said elastomeric connector.

2. The electronic assembly of claim 1, further comprising an encapsulant placed in between said integrated circuit package and said heat sink.

3. The electronic assembly of claim 2, further comprising a mounting pin that mounts and aligns each of said housing units with said substrate.

4. The electronic assembly of claim 1, wherein each of said plurality of conductive portions of said elastomeric connector is aligned with said solder ball and said surface pad of said substrate in order to provide an electrical connection between said solder ball and said surface pad of said substrate.

5. The electronic assembly of claim 1, wherein said elastomeric connector comprises a plurality of metallic leaves that are embedded into a silicone rubber pad.

6. The electronic assembly of claim 1, wherein said spring clip comprises a flexible steel wire that is flexible enough to wrap around said heat sink but has a high enough yield pint to exert a spring force onto said heat sink and said integrated circuit package.

7. The electronic assembly of claim 1, wherein said integrated circuit package includes an integrated circuit mounted to a package substrate, wherein said solder ball is attached to said package substrate.

8. The electronic assembly of claim 1, wherein said elastomeric connector is in a deflected state.

9. An electronic assembly, comprising:
   an integrated circuit package that has a solder ball;
   a substrate that has a conductive surface pad;
   an elastomeric connector that contains a conductive portion adjacent to a dielectric elastomeric material, said conductive portion couples said solder ball to said conductive surface pad; and,
   a housing that is mounted to said substrate and aligns said conductive portion with said solder ball and said conductive surface pad; and a heat sink including a pedestal and a fin, said heat sink used to sandwich said integrated circuit package in between said substrate and said heat sink.

10. The electronic assembly of claim 9, further comprising a mounting pin that aligns said housing with said substrate.

11. The electronic assembly of claim 9, further comprising an encapsulant placed in between said integrated circuit and said heat sink.

12. The electronic assembly of claim 11, further comprising a spring clip that couples said heat sink to said housing unit.

13. The electronic assembly of claim 9, wherein said integrated circuit package includes an integrated circuit mounted to a package substrate, wherein said solder ball is attached to said package substrate.

14. The electronic assembly of claim 9, wherein said elastomeric connector is in a deflected state.

15. A method of assembling an electronic assembly, comprising:
   mounting a pair of housing units on a substrate;
   placing an elastomeric connector in between said pair of housing units;
   placing a solder ball of an integrated circuit package onto said elastomeric connector;
   placing a heat sink on said integrated circuit package; and
   using a spring clip to firmly attach said heat sink to said integrated circuit package.

16. The method of claim 15, further comprising attaching said spring clip to corresponding tabs of said pair of housing units.

17. The method of claim 16, wherein attachment of said heat sink pushes said integrated circuit package and said elastomeric connector into said substrate to insure an electrical connection between said solder ball and a corresponding surface pad of said substrate.

18. The method of claim 17, further comprising mounting said pair of housing units onto said substrate using a mounting pin.

19. The method of claim 18, wherein the attachment of said heat sink deflects said elastomeric connector.

20. An electronic assembly, comprising:
   an integrated circuit package comprising:
      a first substrate;
      a plurality of solder balls disposed on the lower side of said first substrate;
      an integrated circuit disposed on the upper side of said first substrate; and,
      an encapsulant enclosing said integrated circuit by making contact with the upper side of said first substrate;
   a second substrate having an upper side with a plurality of surface pads;
   a pair of housing units mounted on the upper side of said second substrate, wherein said housing units include respective outwardly protruding tabs;
   an elastomeric connector interposed between said first and second substrates, wherein said elastomeric connector comprises a plurality of conductive portions that electrically connect said solder balls of said first substrate to respective surface pads of said second substrate;
   a heat sink having a pedestal and a plurality of fins, wherein said pedestal is disposed on the upper side of said encapsulant; and,
   a spring clip coupled to said heat sink and engaged with said outwardly protruding tabs of said housing units to generate an upward bias force on said pair of housing units and a downward bias force on said heat sink, thereby placing said elastomeric connector in compression.

21. An electronic assembly, comprising:
   an integrated circuit package comprising:
      a first substrate;
      a plurality of solder balls disposed on the lower side of said first substrate;
      an integrated circuit disposed on the upper side of said first substrate; and,
      an encapsulant enclosing said integrated circuit by making contact with the upper side of said substrate;
   a second substrate having an upper side with a plurality of surface pads;
   a pair of housing units mounted on the upper side of said second substrate, wherein said housing units include respective outwardly protruding tabs;
   an elastomeric connector interposed between said first and second substrates, wherein said elastomeric connector comprises a plurality of conductive portions that electrically connect said solder balls of said first substrate to respective surface pads of said second substrate;
   a heat sink having a pedestal and a plurality of fins, wherein said pedestal is disposed on the upper side of said encapsulant; and,
   means for generating an upward bias force on said pair of housing units and a downward bias force on said heat sink, thereby placing said elastomeric connector in compression.

22. An electronic assembly comprising:
   an integrated circuit package with a plurality of solder balls;
   a substrate having an upper side with a plurality of surface pads;
   a pair of housing units mounted on the upper side of said substrate, wherein said housing units include respective outwardly protruding tabs;
   an elastomeric connector interposed between said integrated circuit package and said substrate, wherein said elastomeric connector comprises a plurality of conductive portions that electrically connect said solder balls to respective surface pads of said substrate;
   a heat sink having a pedestal and a plurality of fins, wherein said pedestal is disposed on said integrated circuit package; and,
   a spring clip coupled to said heat sink and engaged with said outwardly protruding tabs of said housing units to generate an upward bias force on said pair of housing units and a downward bias force on said heat sink, thereby placing said elastomeric connector in compression.

23. An electronic assembly comprising:
   an integrated circuit package comprising:
      a first substrate;
      a plurality of solder balls disposed on the lower side of said first substrate;
      an integrated circuit disposed on the upper side of said first substrate; and,
      an encapsulant enclosing said integrated circuit by making contact with the upper side of said first substrate;
   a second substrate having an upper side with a plurality of surface pads;
   a pair of housing units mounted on the upper side of said second substrate;
   an elastomeric connector interposed between said first and second substrates, wherein said elastomeric connector comprises a plurality of conductive portions that electrically connect said solder balls of said first substrate to respective surface pads of said second substrate;
   a heat sink having a pedestal and a plurality of fins, wherein said pedestal is disposed on the upper side of said encapsulant; and,
   a spring clip coupled to said heat sink and engaged with a portion of said housing units to generate an upward bias force on said pair of housing units and a downward bias force on said heat sink, thereby placing said elastomeric connector in compression.

* * * * *